(12) United States Patent
Udono

(10) Patent No.: US 12,448,704 B2
(45) Date of Patent: Oct. 21, 2025

(54) MG$_2$SI SINGLE CRYSTAL, MG$_2$SI SINGLE CRYSTAL SUBSTRATE, INFRARED LIGHT RECEIVING ELEMENT AND METHOD FOR PRODUCING MG$_2$SI SINGLE CRYSTAL

(71) Applicants: Ibaraki University, Mito (JP); JX Nippon Mining & Metals Corporation, Tokyo (JP)

(72) Inventor: Haruhiko Udono, Hitachi (JP)

(73) Assignees: JX ADVANCED METALS CORPORATION, Tokyo (JP); IBARAKI UNIVERSITY, Mito (JP)

( * ) Notice: Subject to any disclaimer, the term of this patent is extended or adjusted under 35 U.S.C. 154(b) by 811 days.

(21) Appl. No.: 17/420,593

(22) PCT Filed: Feb. 25, 2021

(86) PCT No.: PCT/JP2021/007223
§ 371 (c)(1),
(2) Date: Jul. 2, 2021

(87) PCT Pub. No.: WO2022/064735
PCT Pub. Date: Mar. 31, 2022

(65) Prior Publication Data
US 2022/0341057 A1    Oct. 27, 2022

(30) Foreign Application Priority Data

Sep. 25, 2020 (JP) .................. 2020-161367

(51) Int. Cl.
C30B 29/52 (2006.01)
C30B 11/02 (2006.01)
(Continued)

(52) U.S. Cl.
CPC .............. *C30B 29/52* (2013.01); *C30B 11/02* (2013.01); *H10F 77/12* (2025.01)

(58) Field of Classification Search
CPC ........ C30B 29/52; C30B 11/02; H01L 31/032
(Continued)

(56) References Cited

U.S. PATENT DOCUMENTS

2010/0051081 A1* 3/2010 Iida ..................... C04B 35/6455
                                                         423/349
2019/0245129 A1* 8/2019 Iida ...................... H10N 10/857
2020/0052142 A1   2/2020 Udono et al.

FOREIGN PATENT DOCUMENTS

JP          61168589 A  *  7/1986
JP       2002-289627 A    10/2002
(Continued)

OTHER PUBLICATIONS

Udono, et. al.; Crystal growth and characterization of mh2si for ir detectors and thermoelectric applications; Jun. 8, 2015; japanese journal of applied physics, 54, 07JB06 (2015); whole document (Year: 2023).*

(Continued)

*Primary Examiner* — Tahseen Khan
(74) *Attorney, Agent, or Firm* — Birch, Stewart, Kolasch & Birch, LLP

(57) ABSTRACT

Provided is a Mg$_2$Si single crystal in which generation of low-angle grain boundaries in the crystal is satisfactorily suppressed. A Mg$_2$Si single crystal, wherein a variation in crystal orientation as measured by XRD is in a range of ±0.020°.

6 Claims, 8 Drawing Sheets

(51) Int. Cl.
*H01L 31/032* (2006.01)
*H10F 77/12* (2025.01)

(58) Field of Classification Search
USPC .......................................................... 428/220
See application file for complete search history.

(56) References Cited

FOREIGN PATENT DOCUMENTS

| JP | 2006-1788 A | | 1/2006 |
|---|---|---|---|
| JP | 2012190984 A | * | 10/2012 |
| JP | 2015-145512 A | | 8/2015 |
| JP | 2017-132655 A | | 8/2017 |
| WO | WO 2019/187222 A1 | | 10/2019 |

OTHER PUBLICATIONS

Machine_English_translation_JP_61168589_A; Namikawa et. al.; Crucible for Producing Compound Semiconductor; Jul. 30, 1986; EPO; whole document (Year: 2024).*
Machine_english_translation_JP_2012190984_A; Inada et. al.; Magnesium silicide powder; Oct. 4, 2012; EPO; whole document (Year: 2024).*
J. Soga et. al.; sticking-free growth of bulk Mg2Si crystals by the vertical Bridgman method and their thermoelectric properties; Dec. 2005; International Conference on Thermoelectrics; whole document (Year: 2024).*
Akiyama et al., "Fabrication of $Mg_2Si$ pn-junction Photodiode with Shallow Mesa-structure and Ring Electrode", Proc. Asia-Pacific Conf. on Semiconducting Silicides and Related Materials 2016, JJAP Conf. Proc., 2017, vol. 5, pp. 011102-1-011102-5.
Daitoku et al., "Fabrication and Characterization of $Mg_2Si$ pn-junction Photodiode with a Ring Electrode", Proc. Int. Conf. Summer School on Advanced Silicide Technology 2014, JJAP Conf. Proc., 2015, vol. 3, pp. 011103-1-011103-4.
International Search Report for PCT/JP2021/007223 (PCT/ISA/210) mailed on Mar. 30, 2021.
Tokairin et al., "Crystal growth of $Mg_2Si$ for IR-detector", Journal of Crystal Growth, 2016, vol. 468, pp. 761-765.
Udono et al., "Infrared photoresponse from pn-junction $Mg_2Si$ diodes fabricated by thermal diffusion", Journal of Physics and Chemistry of Solids, 2012, vol. 74, pp. 311-314.
Written Opinion of the International Searching Authority for PCT/JP2021/007223 (PCT/ISA/237) mailed on Mar. 30, 2021.
International Preliminary Report on Patentability and English translation of the Written Opinion of the International Searching Authority (Forms PCT/IB/338, PCT/IB/373 and PCT/ISA/237) for International Application No. PCT/JP2021/007223, dated Apr. 6, 2023.
Akasaka et al., "Non-wetting crystal growth of $Mg_2Si$ by vertical Bridgman method and thermoelectric characteristics," Journal of Crystal Growth, vol. 304, 2007 (Available online Mar. 6, 2007), pp. 196-201.
Extended European Search Report for corresponding European Application No. 21731378.2, dated Nov. 25, 2022.
Li et al., "Magnesium silicide intermetallic alloys," Database INSPEC [online], The Institute of Electrical Engineers, Accession No. 4593787, Nov. 1993, 2 pages total.
Soga et al., "Sticking-free growth of bulk $Mg_2Si$ crystals by the vertical Bridgman method and their thermoelectric properties," 2005 International Conference on Thermoelectrics, IEEE, 2005, 4 pages total.
Udono et al., "Crystal growth and characterization of $Mg_2Si$ for IR-detectors and thermoelectric applications," Japanese Journal of Applied Physics, vol. 54, 2015, pp. 07JB06-1 to 07JB06-10 (11 pages total).
Japanese Notice of Reasons for Refusal for corresponding Japanese Application No. 2021-529487, dated Dec. 5, 2023, with an English translation.
Makoto et al., "Growth and Electrical Characterization of High Purity Mg2Sn Single Crystal," Proceedings of the 70th Annual Meeting of Japan Society of Applied Physics, 2009, 1 page total.
Masubuchi et al., "Evaluation of crystalline quality of Mg2Si using high resolution XRD," 67th Japan Society of Applied Physics Spring Academic Lecture Meeting [Lecture Proceedings], Feb. 28, 2020, 1 page total.
Yaguchi et al., "IR absorption measurement of Mg2Si and evaluation of free electron density," Japan Society of Applied Physics, 2017, 1 page total.
Chinese Office Action and Search Report for Chinese Application No. 202180001913.3, dated Aug. 30, 2025, with English translation.
Sakuma et al., "Thermoelectric properties of Mg2Si1—xCx crystals grown by the vertical Bridgman method," Materials Research Society Symp. Proc., vol. 886, 2006, p. 0886-F11-13.1-0886-F11-13.6.
Yin et al., "In situ nanostructure design leading to a high figure of merit in an eco-friendly stable Mg2SiO.3OSnO.7O solid solution," RSC Advances, vol. 6, 2016, pp. 16824-16831.

* cited by examiner

MG$_2$SI SINGLE CRYSTAL, MG$_2$SI SINGLE CRYSTAL SUBSTRATE, INFRARED LIGHT RECEIVING ELEMENT AND METHOD FOR PRODUCING MG$_2$SI SINGLE CRYSTAL

FIELD OF THE INVENTION

The present invention relates to a Mg$_2$Si single crystal, a Mg$_2$Si single crystal substrate, an infrared light receiving element, and a method for producing a Mg$_2$Si single crystal.

BACKGROUND OF THE INVENTION

With recent dramatic technological innovations in relation to artificial intelligence (AI) and the like, research and development of systems that perform automatic monitoring and controlling instead of human eyes and hands are being energetically carried out. In such automatic monitoring and controlling systems, an appropriate response operation is determined based on various input information such as light, temperatures, and voices, so that a hardware for detecting an input signal will be a key device that plays an important role in the entire system. Especially in terms of detecting light input signals, advanced automatic monitoring and automatic controlling can be achieved by using a device that serves as the human eyes or, in some cases, can detect information in areas that cannot be perceived by the human eyes.

Examples of the devices that detect light input signals include those having elements that convert light signals into electrical signals which can be electronically processed. An example of the basic element is a photodetection element with a semiconductor material.

The photodetection element with the semiconductor material has different detectable wavelength regions depending on bandgaps of the semiconductor materials. In order to perform advanced control that can be used for automatic monitoring at night and automatic driving of automobiles, input information in relation to light in the infrared light region is required in addition to information on light in the visible light region and images. Therefore, there is a strong demand for infrared light receiving elements and devices that can detect light input with higher sensitivity in the infrared light region, and active studies and developments using various semiconductor materials are being promoted.

As a material used for the photo detection elements, a crystalline material of magnesium silicide (Mg$_2$Si), which is a compound semiconductor composed of magnesium (Mg) and silicon (Si), has been proposed, and certain results have been obtained (Non-Patent Literatures 1 and 2).

CITATION LIST

[Non-Patent Literature 1] T. Akiyama et al., Proc. Asia-Pacific Conf. Semicond. Silicides Relat. Mater. 2016, JJAP Conf. Proc. Vol. 5, 2017, pp. 011102-1-011102-5

[Non-Patent Literature 2] K. Daitoku et al., Proc. Int. Conf. Summer School Adv. Silicide Technol. 2014, JJAP Conf. Proc. Vol. 3, 2015, pp. 011103-1-011103-4

SUMMARY OF THE INVENTION

Since the Mg$_2$Si single crystal is an indirect transition type semiconductor having a forbidden width of about 0.61 eV at room temperature, the Mg$_2$Si single crystal can be expected for application to infrared light sensors having a short wavelength infrared region (SWIR, wavelength $\lambda$=0.9 to 2.5 $\mu$m), which have been increasingly used in recent years. However, the presence of low-angle grain boundaries in the crystal may reduce various semiconductor characteristics. Therefore, there is a need for developing a technique for satisfactorily suppressing the generation of low-angle grain boundaries in the crystal.

The technique of the present disclosure is intended to solve the above technical problems. An object of the present invention is to provide a Mg$_2$Si single crystal in which generation of low-angle grain boundaries in the crystal is satisfactorily suppressed. Another object is to provide a Mg$_2$Si single crystal substrate and an infrared light receiving element, which are composed of the Mg$_2$Si single crystal. A further object is to provide a method for producing a Mg$_2$Si single crystal.

As a result of intensive studies, the present inventors have found that the above problems can be solved by controlling a variation in crystal orientation in the Mg$_2$Si single crystal to a predetermined range.

Based on such findings and ideas, the present disclosure provides the following inventions:

1) A Mg$_2$Si single crystal, wherein a variation in crystal orientation as measured by XRD is in a range of ±0.020°.
2) The Mg$_2$Si single crystal according to 1), wherein the variation in crystal orientation as measured by XRD is in a range of ±0.016°.
3) The Mg$_2$Si single crystal according to 1) or 2), wherein the single crystal comprises at least one selected from B, Li, Al, Ag, P, As and Sb as a dopant.
4) A Mg$_2$Si single crystal substrate, comprising the Mg$_2$Si single crystal according to any one of 1) to 3).
5) A Mg$_2$Si single crystal substrate according to 4), wherein the substrate has a size of 25 mm to 150 mm.
6) An infrared light receiving element, comprising the Mg$_2$Si single crystal according to any one of 1) to 3).
7) A method for producing the Mg$_2$Si single crystal according to any one of 1) to 3), the method comprising the following steps (1) to (5):
   (1) a raw material preparation step of preparing a raw material comprising at least Mg and Si;
   (2) a raw material filling step of filling the raw material prepared in the step (1) in a pBN crucible, at least an inner surface of the pBN crucible being coated with BN;
   (3) a synthesis step of heating the entire crucible to cause a melting chemical reaction of the raw material filled in the crucible in the step (2);
   (4) a step of cooling a melt produced in the step (3) to deposit a Mg$_2$Si single crystal; and
   (5) a step of removing the Mg$_2$Si single crystal deposited in the step (4) from the crucible.

According to the technique of the present disclosure, it is possible to provide a Mg$_2$Si single crystal in which generation of low-angle grain boundaries in the crystal is satisfactorily suppressed.

Figure 1:
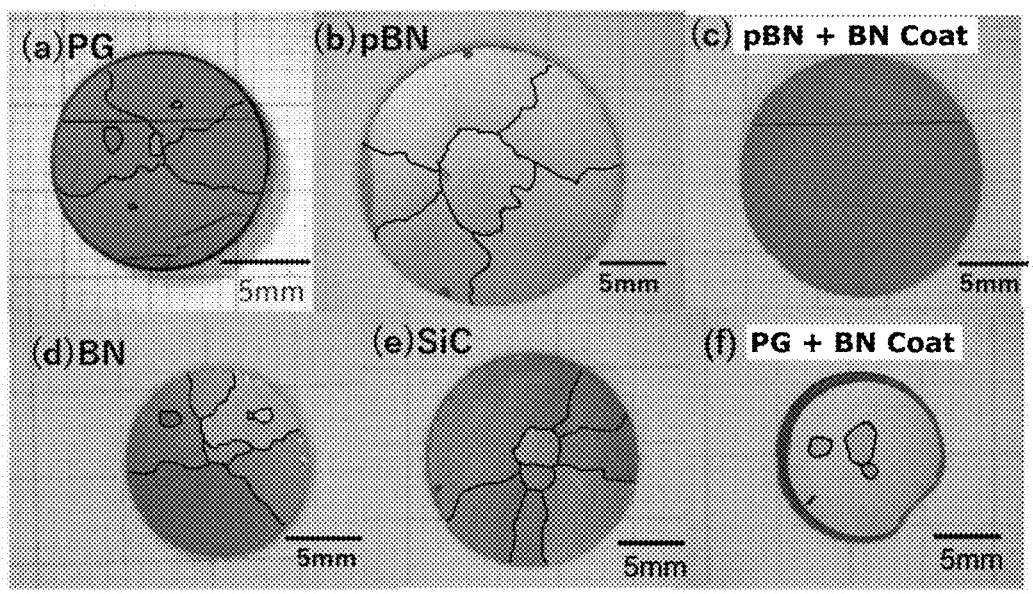
FIG. 1 is appearance observation photographs of polished surfaces of substrates according to Examples and Comparative Examples.

DETAILED DESCRIPTION OF THE INVENTION ($Mg_2Si$ Single Crystal)

The $Mg_2Si$ single crystal according to the present disclosure is controlled such that a variation in crystal orientation as measured by an XRD (X-ray diffractometer) is in a range of ±0.020°. Since grain boundaries can be regarded as an aggregate of dislocations, their properties can be predicted from the properties of dislocations. In this case, a larger aggregation density of dislocations results in a larger difference of crystal orientations. The grain boundaries having a smaller difference of crystal prentaions are referred to as small-angle grain boundaries. When the variation in crystal orientation is in the range of ±0.020° as in the $Mg_2Si$ single crystal according to the present disclosure, almost no small-angle grain boundaries in the crystal are observed. If there are substantially no or no small-angle grain boundaries in the crystal, it will be difficult for electron-electron hole pairs generated in $Mg_2Si$ to be re-bonded, resulting in improved homogeneity of electrical characteristics such as a carrier life of the $Mg_2Si$ single crystal.

The $Mg_2Si$ single crystal according to the present disclosure is preferably controlled such that the variation in crystal orientation as measured by the XRD (X-ray diffractometer) is in the range of ±0.016°, and more preferably in the range of ±0.01°, and even more preferably in the range of 0°.

The $Mg_2Si$ single crystal according to the present disclosure may contain at least one selected from B, Li, Al, Ag, P, As and Sb as a dopant (impurity). When the $Mg_2Si$ single crystal contains these elements as dopants, the carrier concentration is increased so that the conductivity and IV characteristics of the semiconductor device are improved.

When the $Mg_2Si$ single crystal according to the present disclosure contains B as a dopant, it preferably contains B such that the carrier concentration is $1\times10^{16}$ $cm^{-3}$ or more and $1\times10^{19}$ $cm^{-3}$ or less, and when it contains Li as a dopant, it preferably contain Li such that the carrier concentration is $1\times10^{16}$ $cm^{-3}$ or more and $1\times10^{19}$ $cm^{-3}$ or less, and when it contains Al, Ag, P, As, and Sb, it preferably contains them such that the carrier concentration is $1\times10^{16}$ $cm^{-3}$ or more and $1\times10^{19}$ $cm^{-3}$ or less.

The $Mg_2Si$ single crystal according to the present disclosure has a shape including a cylindrical straight body, because it is often produced by a melt growth method such as a VB (vertical Bridgeman) method or a VGF (vertical gradient freeze) method as described later, although not particularly limited thereto. Further, the straight body portion has a diameter of from 25 mm to 200 mm.

($Mg_2Si$ Single Crystal Substrate)

A $Mg_2Si$ single crystal substrate according to the present disclosure includes the $Mg_2Si$ single crystal according to the above technique of the present disclosure. The $Mg_2Si$ single crystal substrate may have a size (maximum diameter) of from 25 mm to 150 mm, although not particularly limited thereto. Further, the $Mg_2Si$ single crystal substrate may have a planar shape of a circle or a rectangle such as a quadrangle.

The $Mg_2Si$ single crystal substrate preferably has a thickness of from 200 μm to 1000 μm, and more preferably from 300 μm to 700 μm, for example, although not particularly limited thereto. In particular when the diameter is larger, the $Mg_2Si$ single crystal substrate having a thickness of less than 300 μm may crack, and the substrate having a thickness of more than 1000 μm may result in waste of the single crystal that is the base material.

(Infrared Light Receiving Element)

An infrared light receiving element can be produced using the $Mg_2Si$ single crystal according to the present disclosure. The infrared light receiving element can employ, for example, the $Mg_2Si$ single crystal according to the present disclosure as a p-type or n-type light absorption region used for p-n junction photodiodes, although not particularly limited thereto. According to the present disclosure, it is possible to provide the $Mg_2Si$ single crystal having improved various semiconductor characteristics. Further, the light absorption coefficient near a forbidden band energy is increased, so that the light detection sensitivity can be increased. Further, the energy gap (Eg) can be reduced, thereby producing an infrared light receiving element that can expand the receivable cutoff wavelength, and can detect infrared light having a longer wavelength. Therefore, the production of the infrared light receiving element including the semiconductor material can allow deterioration of various devices for sensing and imaging in the infrared light region to be suppressed. Accordingly, significant contribution can be expected to technologies such as various image analysis and image diagnosis, as well as automatic monitoring and control technologies using them, and industrial fields using those technologies.

(Method for Producing $Mg_2Si$ Single Crystal)

The $Mg_2Si$ single crystal according to the resent disclosure can be produced by a melting method including the following steps (1) to (5):

(1) a raw material preparation step of preparing a raw material containing at least Mg and Si;

(2) a raw material filling step of filling the raw material prepared in the step (1) in a pBN crucible, at least an inner surface of the pBN crucible being coated with BN;

(3) a synthesis step of heating the entire crucible to cause a melting chemical reaction of the raw material filled in the crucible in the step (2);

(4) a step of cooling a melt produced in the step (3) to deposit a $Mg_2Si$ single crystal; and (5) a step of removing the $Mg_2Si$ single crystal deposited in the step (4) from the crucible.

The method for producing the $Mg_2Si$ single crystal as described above is preferably carried out by a melt growth method such as a VB (vertical Bridgeman) method and a VGF (vertical gradient freeze) method, because it can efficiently produce a single crystal having high quality, although not particularly limited thereto. Further, a production device can use known configurations except for the crucible.

The raw materials Mg and Si prepared in the above step (1) may preferably employ highly purified and chunk-shaped particles having a purity of 4N (99.99%) or more, and more preferably 5N (99.999%) or more, and more preferably 6N (99.9999%), and having an average particle size of from about 2 to 3 mm. In general, Mg and Si are mixed such that the total of the raw materials Mg particles and Sn particles has an element ratio of 2:1. When producing the single crystal containing a dopant, an appropriate amount of the dopant is previously added to the raw material in (1) the raw material preparation step as described above.

The crucible used in the above step (2) is made of pBN (pyrolytic boron nitride), and its inner surface is coated with BN (boron nitride). As used herein, the pBN crucible coated with BN refers to a pBN (pyrolysis boron nitride) crucible in which layers of BN fine particles are formed on the surface of the crucible, for example, a pBN (pyrolysis boron nitride) crucible in which the surface of the crucible is coated with BN fine particles (a commercially available BN coating material such as "Whity Seven" from Audec Corporation), and the like. Conventional crucibles use carbon crucibles or carbon crucibles whose inner surfaces are coated with PG (pyrolytic graphite), so that the crucibles have higher wettability, and the $Mg_2Si$ single crystals grown in the crucible may adhere to the inner surfaces of the crucibles. Therefore, in the conventional crucibles, a large stress is applied in the crystal during cooling after crystal growth, and small-angle grain boundaries tend to occur in the crystal. On the contrary, in the method for producing the $Mg_2Si$ single crystal according to the present disclosure, as described above, the crucible used is made of pBN (pyrolytic boron nitride), and the inner surface is coated with BN (boron nitride), so that the crucible has lower wettability, and it is possible to satisfactorily suppress the $Mg_2Si$ single crystal grown in the crucible from adhering to the inner surface of the crucible. Therefore, a large stress is not applied in the crystal during cooling after crystal growth, the generation of small-angle grain boundaries in the crystal can be suppressed, and the variation in crystal orientation in the $Mg_2Si$ single crystal can be controlled in the range of ±0.020°.

A pressure during heating in the synthesis step of the above step (3) may be atmospheric pressure, but heating in an Ar gas at about 3 atm is desirable. A heating temperature is from 1085° C. (a melting point of $Mg_2Si$) to 1095° C., for example, the heat treatment is carried out for about 15 minutes to 14 hours in total. The heating at the temperature of 1085° C. or more can allow Mg and Si to melted to form an Mg—Si melt.

In the synthesis step of the above step (3), a temperature gradient in which the temperature on the $Mg_2Si$ seed crystal side is relatively low, and the temperature on the $Mg_2Si$ raw material side is relatively high in the axial direction of the crucible is formed by moving the crucible downward in the axial direction in the VB method, or adjusting the temperature of the heater in the VGF method. Thus, the molten $Mg_2Si$ raw material is solidified in order from the $Mg_2Si$ seed crystal side to grow the $Mg_2Si$ single crystal. All the melted $Mg_2Si$ raw materials in the conical portion and the straight body portion of the crystal growth portion are solidified in that order to form the $Mg_2Si$ single crystal.

Further, to make an infrared light detector, a single crystal film of the semiconductor material comprised of the $Mg_2Si$ single crystal according to the present disclosure can be used in the light absorption region of the detector. In this case, the single crystal film can be produced by a generally known semiconductor film deposition technique such as a molecular beam epitaxy method (MBE method), a metalorganic chemical vapor deposition method (MOCVD method), and a sputtering deposition method.

In the MBE method, generally, Mg and Si are simultaneously fed by molecular beam obtained by evaporating them in a vacuum vessel, and the composition ratio is adjusted to deposit $Mg_2Si$ on a certain substrate. During the deposition, the substrate is generally heated. The heating temperature is generally higher than or equal to 100° C. and lower than or equal to 650° C. (melting point of Mg). By the heating, the molecules deposited on the substrate react to grow a single crystal $Mg_2Si$ film.

In the MOCVD method, generally, organometallic gases containing Mg and Si are simultaneously fed in a reaction vessel, and the composition ratio is adjusted to deposit $Mg_2Si$ on a certain substrate. During the deposition, the substrate is generally heated. The heating temperature is generally higher than or equal to 100° C. and lower than or equal to 650° C. (melting point of Mg). By the heating, the organometallic gases react on the substrate to grow a single crystal $Mg_2Si$ film.

In the sputter deposition method, generally, a solid target containing Mg and Si is sputtered in a reaction vessel with Ar ions to feed sputter molecules, and the composition ratio is adjusted to deposit $Mg_2Si$ on a certain substrate. During the deposition, the substrate is generally heated. The heating temperature is generally higher than or equal to 100° C. and lower than or equal to 650° C. (melting point of Mg). By the heating, sputter molecules react on the substrate to grow a single crystal $Mg_2Si$ film.

It should be noted that the descriptions of the above embodiments are for explaining the present invention, and they are not intended to limit or restrict the scope of the inventions recited in the claims. Further, the configuration of each part of the present invention is not limited to the above embodiments, and various modifications may be made within the technical scope recited in the claims.

EXAMPLES

Hereinafter, the technical contents of the present disclosure will be specifically described based on Examples. The following Examples are merely specific examples for facilitating the understanding of the technical contents of the present disclosure, and the technical scope of the present invention is not limited by these specific Examples.

Example 1

(Production of $Mg_2Si$ Single Crystal)

The VB (Vertical Bridgeman) method was used to produce the $Mg_2Si$ single crystal according to Example 1. First, a pBN crucible having an inner diameter of 19 mmφ and a length of 10 cm was prepared, and a BN coating material "Whity Seven" from Audec Corporation was applied onto an inner surface of the pBN crucible to have a thickness of 0.1 mm, naturally dried for 12 hours, and then heated at 200° C. to prepare a pBN crucible coated with BN. The pBN crucible having the inner surface coated with BN was filled with a raw material mixture of Mg particles with a purity of 6N [chunk material (an average particle size of 2 to 3 mm) from OSAKA ASAHI METAL MFG, CO., LTD.], and Si particles with a purity of 10N [chunk material (an average particle size of 2 to 3 mm) from Furuuchi Chemical Corporation].

The crucible was then placed on a crucible holding table and sealed in a quartz ampoule together with an Ar gas at 560 Torr, and it was placed in an electric furnace (resistance heating furnace), and heated to 1085° C. (display temperature) over 1.5 hours. After further heating it at the same temperature for 1.5 hours to melt it, the temperature of the electric furnace was increased such that a growth rate was 10 mm/h, to grow crystals. The furnace was then naturally cooled, and at the time when the temperature reached room temperature, the crucible was removed from the electric furnace to obtain a sample of a single crystal according to Example 1.

Comparative Example 1

A sample was prepared in the same method as that of Example 1, with the exception that a carbon crucible whose inner surface was coated with PG (pyrolytic graphite) was used as the crucible.

Comparative Example 2

A sample was prepared in the same method as that of Example 1, with the exception that a carbon crucible in which a BN coat was further applied onto the PG (pyrolysis graphite) coat of Comparative Example 1 was used as the crucible.

Comparative Example 3

A sample was prepared in the same method as that of Example 1, with the exception that a pBN crucible whose inner surface was not coated was used as the crucible.

Comparative Example 4

A sample was prepared in the same method as that of Example 1, with the exception that a BN crucible whose inner surface was not coated was used as the crucible.

Comparative Example 5

A sample was prepared in the same method as that of Example 1, with the exception that a carbon crucible whose inner surface was coated with SiC was used as the crucible.

(Composition of $Mg_2Si$ Single Crystal)

The composition of the sample of the single crystal according to Example 1 was measured using a fluorescent X-ray analyzer. As a result, the composition was $Mg_2Si$. Further, the compositions of the samples of the single crystals according to Comparative Examples 1 to 5 was measured by the same method. As a result, they were $Mg_2Si$.

(Observation of Grain Boundaries)

From each sample, a substrate having a thickness of 0.6 mm and a diameter of from 11 to 19 mm was prepared, and a surface of each sample was polished with an abrasive having a count #4000. An appearance observation photograph (FIG. 1) of each polished substrate was obtained, and the presence or absence of grain boundaries was evaluated.

In FIG. 1, (a) PG shows Comparative Example 1, (b) pBN shows Comparative Example 3, (c) pBN+BN Coat shows Example 1, (d) BN shows Comparative Example 4, (e) SiC shows Comparative Example 5, and (f) PG+BN shows Comparative Example 2.

In Example 1, the inner surface of the crucible had poor wettability, and the grown crystals did not adhere to the crucible, so that the generation of small-angle grain boundaries in the crystal was well suppressed.

In each Comparative Examples 1 to 5, the inner surface of the crucible had good wettability, the grown crystals adhered to the crucible, and a stress was applied due to a difference between thermal expansion rates of the crucible and the $Mg_2Si$ single crystal during cooling, and the like, and small-angle grain boundaries were generated due to the induction of crystal defects in the crystal.

When comparing the pBN crucible coated with BN according to Example 1 in the present invention with the uncoated pBN crucible according Comparative Example 3 and the uncoated BN crucible according to Comparative Example 4, it is believed that for the pBN crucible coated with BN, the thin BN coated layer on the inner wall surface, which is the double structure, acts as an interfering material, mitigates the influence of the difference of thermal expansion rates, reduces the wettability between the raw material melt and the inner wall of the crucible, and satisfactorily suppresses the generation of small-angle grain boundaries.

(X-Ray Diffraction Measurement)

Figure 2A:
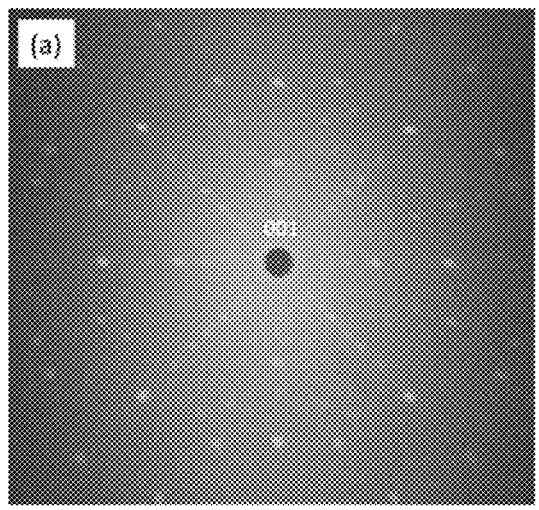
FIG. 2 is evaluation photographs for crystallinity by back reflection Laue according to Examples and Comparative Examples.
Figure 2B:
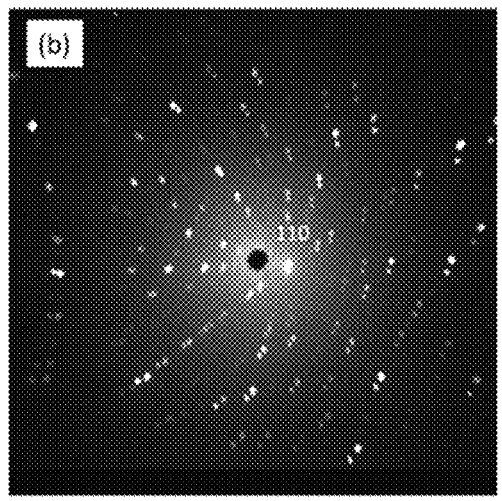

Each of the resulting samples of the single crystal was subjected to a back reflection Laue observation with a spot size of 1 mmφ for incident X-rays. In Example 1, a single diffraction spot was obtained at any part in the sample as shown in FIG. 2 (a), confirming that the entire crystal was a single crystal containing no small-angle grain boundaries. On the other hand, in each of Comparative Examples 1 to 5, there was a part where a single diffraction spot was seen, but a part where a double diffraction spot was seen as shown in FIG. 2 (b) was observed, indicating that the single crystal contained small-angle grain boundaries somewhere.

Figure 3A:
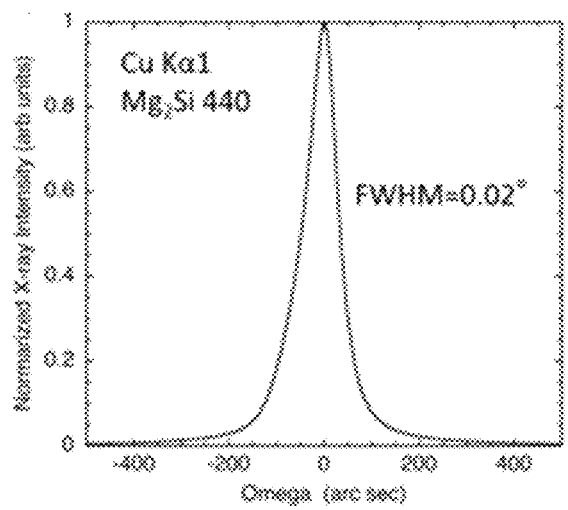
FIG. 3 is XRD charts according to Examples and Comparative Examples.
Figure 3B:
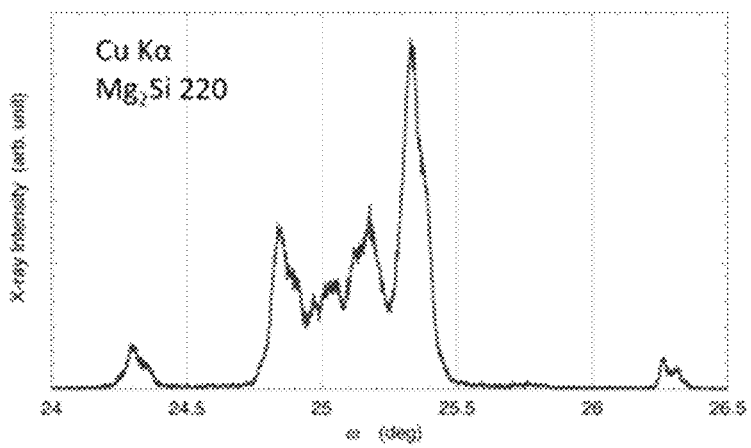

As a result of rocking curve measurement by an X-ray diffraction (XRD) apparatus, in the sample of Example 1, a sharp single peak having a FWHM (full width at half maximum) of 0.02° in 440 $Mg_2Si$ diffractions was observed as shown in FIG. 3 (a), confirming that the variation in crystal orientation in the sample was in the range of ±0.020°. On the other hand, in each sample of Comparative Examples 1 to 5, a plurality of diffraction peaks from the small-angle grains with slightly deviated orientations were observed, and the maximum deviated orientation of at most 2° was observed as shown in FIG. 3 (b).

Figure 4:
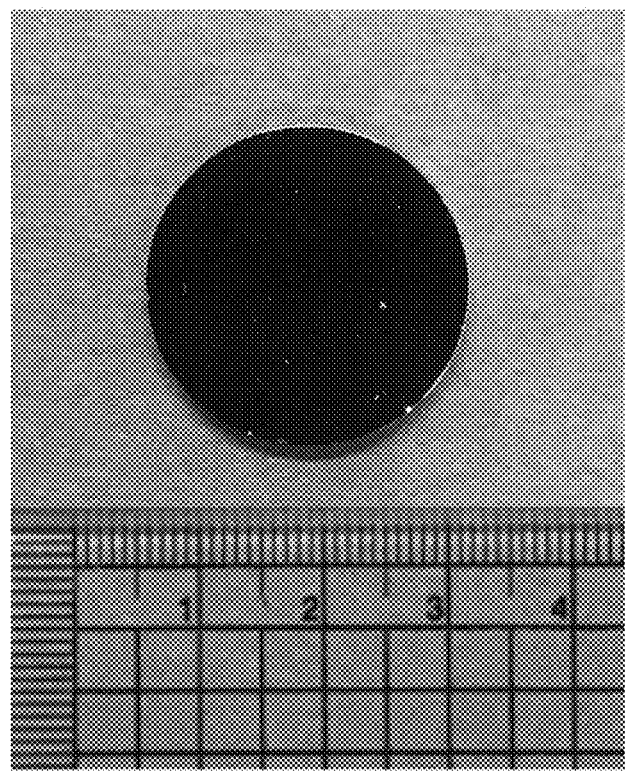
FIG. 4 is a surface observation photograph of a substrate according to Example.
Figure 5:
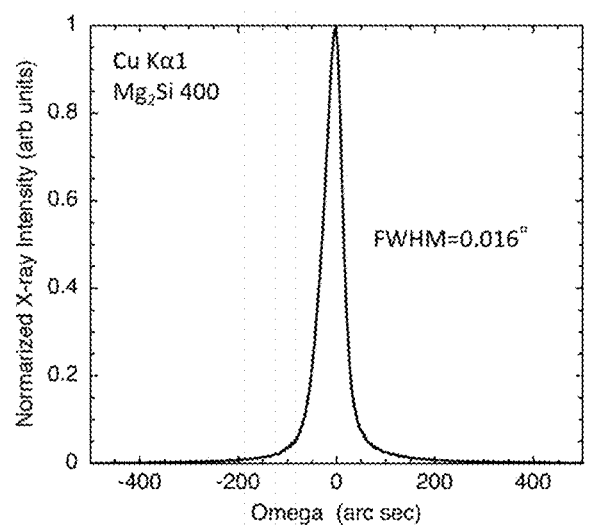
FIG. 5 is an XRD chart according to an Example.

As Example 2, a $Mg_2Si$ crystal was grown in a crucible made of pBN which had an inner diameter of 25 mmφ and a length of 10 cm, and had an inner surface coated with BN, in the same method as that of Example 1. FIG. 4 shows a surface observation photograph of a substrate obtained by cutting the crystal and polishing the cut crystal. The substrate crystal that had a diameter of 25 mmφ and did not contain small-angle grain boundaries was obtained. As a result of measurement of the locking curve of the substrate crystal, as shown in FIG. 5, a sharp single peak having a FWHM (full width at half maximum) of 0.016° in 400 $Mg_2Si$ diffractions was obtained, confirming that the variation in the crystal orientation throughout the sample was in the range of ±0.020°.

(Measurement of IV Characteristics)

Figure 6:
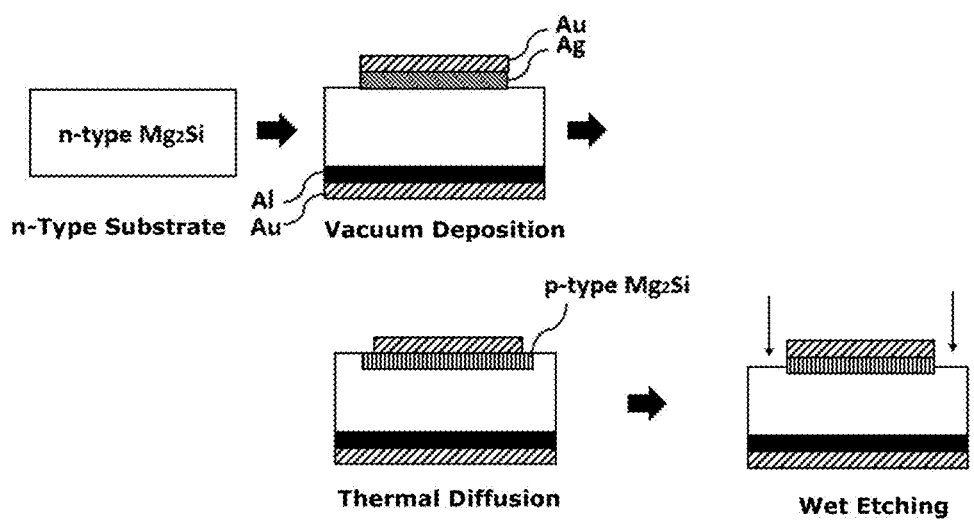
FIG. 6 is an outline of production steps of a sample according to Examples and Comparative Examples.

Al was thermally diffused on the substrate of the pBN+ BN coated crucible according to Example 2 and on the substrate of the PG crucible according to Comparative Example 1 to prepare back electrodes in advance, and an Au protection electrode was further provided on each back surface. An Ag diffusion source (Ag) and an Au cap layer (Au) were then deposited on each surface by vacuum deposition, and thermally diffused. Subsequently, each surface was wet-etched to form a mesa structure, thereby producing a pn junction photodiode. The outline of the production steps of these photodiodes is shown in FIG. 6.

Figure 7:
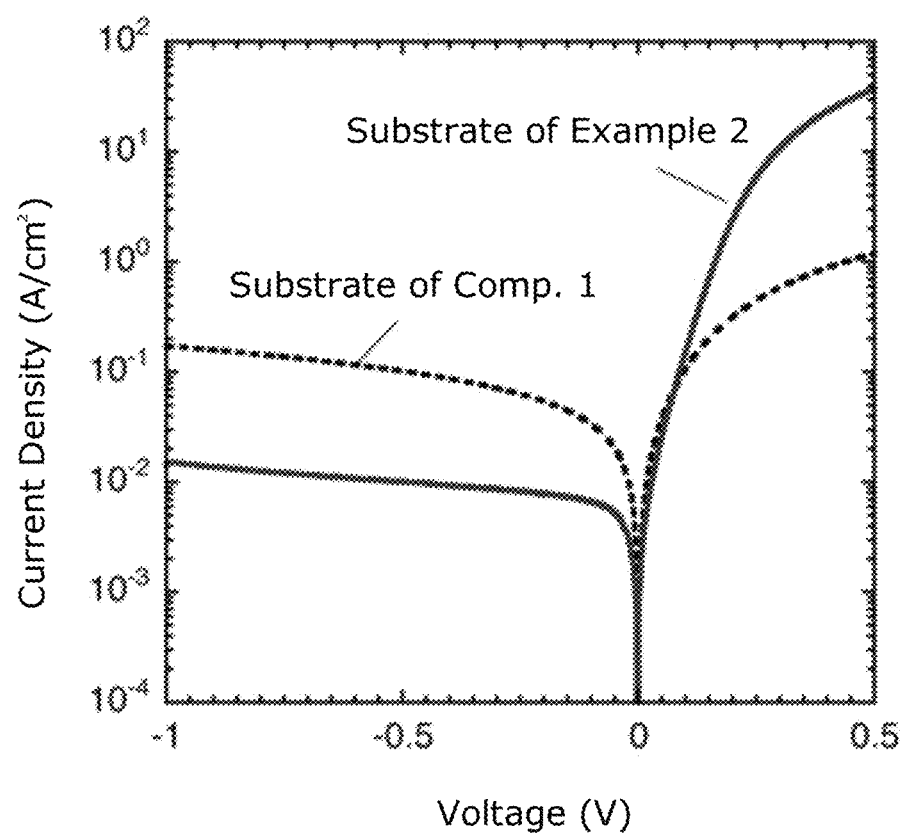
FIG. 7 is a graph showing I-V characteristics of a sample according to an Example and a Comparative Example.

Also, FIG. 7 shows IV characteristics of the samples. In a device on the substrate according to Example 1, a reverse current density was sufficiently low, a forward current density was high, and a rectification ratio at voltages of −1V and +0.5V applied showed a good value of 2300 or more. On the other hand, in a photodiode produced on the substrate according to Comparative Example 1 at a part including the small-angle grain boundaries, a rectification property was confirmed, but the rectification ratio was 6, which was lower.

Figure 8:
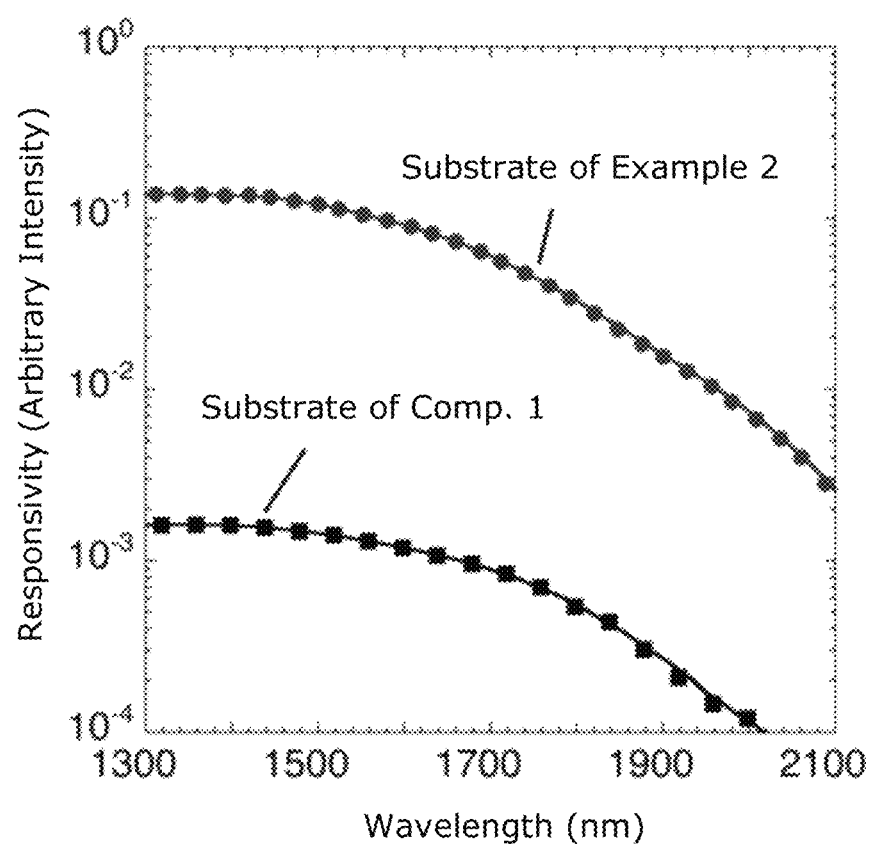
FIG. 8 is a graph showing responsivities of samples according to an Example and a Comparative Example.

FIG. 8 shows responsivities of the photodiodes. The photodiode on the substrate according to Example 2 has higher responsivity by approximately two orders of magnitude than the photodiode on the substrate according to Comparative Example 1.

The invention claimed is:

1. A $Mg_2Si$ single crystal, wherein a variation in crystal orientation as measured by XRD is in a range of ±0.020°, and
the single crystal comprises at least one of B, Li, Al, P, and As as a dopant.

2. The $Mg_2Si$ single crystal according to claim 1, wherein the variation in crystal orientation as measured by XRD is in a range of ±0.016°.

3. A $Mg_2Si$ single crystal substrate, comprising the $Mg_2Si$ single crystal according to claim 1.

4. A $Mg_2Si$ single crystal substrate according to claim 3, wherein the substrate has a size of 25 mm to 150 mm.

5. An infrared light receiving element, comprising the $Mg_2Si$ single crystal according to claim 1.

6. A method for producing the $Mg_2Si$ single crystal according to claim 1, the method comprising the following steps (1) to (5):
   (1) a raw material preparation step of preparing a raw material comprising at least Mg and Si;
   (2) a raw material filling step of filling the raw material prepared in the step (1) in a pBN crucible, at least an inner surface of the pBN crucible being coated with BN;
   (3) a synthesis step of heating the entire crucible to cause a melting chemical reaction of the raw material filled in the crucible in the step (2);
   (4) a step of cooling a melt produced in the step (3) to deposit a $Mg_2Si$ single crystal; and
   (5) a step of removing the $Mg_2Si$ single crystal deposited in the step (4) from the crucible.

* * * * *